(12) United States Patent
Tang et al.

(10) Patent No.: US 11,707,002 B2
(45) Date of Patent: Jul. 18, 2023

(54) CBRAM WITH CONTROLLED BRIDGE LOCATION

(71) Applicant: INTERNATIONAL BUSINESS MACHINES CORPORATION, Armonk, NY (US)

(72) Inventors: Jianshi Tang, Elmsford, NY (US); Takashi Ando, Eastchester, NY (US); Reinaldo Vega, Mahopac, NY (US); Praneet Adusumilli, Somerset, NJ (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 87 days.

(21) Appl. No.: 17/233,968

(22) Filed: Apr. 19, 2021

(65) Prior Publication Data

US 2021/0242402 A1 Aug. 5, 2021

Related U.S. Application Data

(62) Division of application No. 16/458,857, filed on Jul. 1, 2019, now Pat. No. 11,050,023.

(51) Int. Cl.
*H01L 45/00* (2006.01)
*H10N 70/00* (2023.01)
*H10B 63/00* (2023.01)
*H10N 70/20* (2023.01)

(52) U.S. Cl.
CPC ........... *H10N 70/063* (2023.02); *H10B 63/80* (2023.02); *H10N 70/24* (2023.02); *H10N 70/826* (2023.02); *H10N 70/8416* (2023.02)

(58) Field of Classification Search
CPC ............................. H01L 45/1675; H01L 45/08

USPC ............................................................ 257/4
See application file for complete search history.

(56) References Cited

U.S. PATENT DOCUMENTS

| | | | |
|---|---|---|---|
| 7,855,435 B2 | 12/2010 | Klostermann et al. | |
| 7,897,955 B2 | 3/2011 | Jin et al. | |
| 7,960,216 B2 | 6/2011 | Phatak | |
| 8,129,250 B2 | 3/2012 | Rossel et al. | |
| 8,853,713 B2 | 10/2014 | Marsh et al. | |
| 9,114,908 B2 | 8/2015 | Zhou et al. | |
| 9,153,779 B2 | 10/2015 | Ariga et al. | |
| 9,613,694 B1 | 4/2017 | Li et al. | |
| 9,805,793 B2 | 10/2017 | Rajamohanan et al. | |
| 2004/0161894 A1* | 8/2004 | Gilton | H01L 23/5256 438/257 |
| 2008/0248624 A1* | 10/2008 | Horak | H10B 63/80 257/E21.477 |
| 2014/0264247 A1 | 9/2014 | Daryanani et al. | |
| 2015/0364680 A1* | 12/2015 | Molas | H01L 45/1233 257/4 |

(Continued)

OTHER PUBLICATIONS

List of IBM Patents or Patent Applications Treated as Related dated Apr. 19, 2021, 2 pages.

(Continued)

*Primary Examiner* — Dzung Tran
(74) *Attorney, Agent, or Firm* — Tutunjian & Bitetto, P.C.; Randy Emilio Tejeda

(57) ABSTRACT

Devices with settable resistance and methods of forming the same include forming vertical dielectric structures from heterogeneous dielectric materials on a first electrode. A second electrode is formed on the vertical dielectric structures.

17 Claims, 5 Drawing Sheets

(56) References Cited

U.S. PATENT DOCUMENTS

2017/0154950 A1* 6/2017 Basker .................... H01L 27/13
2019/0189558 A1* 6/2019 Reznicek ............ H01L 23/5226

OTHER PUBLICATIONS

Shinhyun Choi et al., "SiGe epitaxial memory for neuromorphic computing with reproducible high performance based on engineered dislocations", Nature Materials, Apr. 2018, pp. 335-340, vol. 17.
Y. Hayakawa et al., "Highly reliable TaOx ReRAM with centralized filament for 28-nm embedded application", 015 Symposium on VLSI Technology Digest of Technical Paper, Jun. 2015.

* cited by examiner

CBRAM WITH CONTROLLED BRIDGE LOCATION

BACKGROUND

The present invention generally relates to resistive memory devices and, more particularly, to conductive bridge random access memory (CBRAM) with predictable bridge formation locations.

CBRAM devices use phase changes in an amorphous switching medium to alter the conductivity of a cell and, thereby, to change a value stored in the cell. The resulting resistance value is stable, until an appropriate current is used to change the switching medium's phase. In particular, a bridge of material of a different phase is formed between two electrodes. The bridge's phase has a lower resistivity than the resistivity of the bulk material's phase. By changing the length of the bridge (e.g., using a set current to generate heat and shift switching material from one phase to another), the resistance of the device can be set.

SUMMARY

A method of forming a device with settable resistance includes forming vertical dielectric structures from heterogeneous dielectric materials on a first electrode. A second electrode is formed on the vertical dielectric structures.

A conductive bridge random access memory (CBRAM) device includes a first electrode. Vertical dielectric structures are formed from heterogeneous dielectric materials on the first electrode. A second electrode is formed on the vertical dielectric structures.

A CBRAM device includes a first electrode. A mandrel is formed from a first dielectric material and partially covers the first electrode. A first sidewall spacer is formed from a second dielectric material, different from the first dielectric material, on a sidewall of the mandrel. A second sidewall spacer is formed from a third material, different from the second dielectric material, on a sidewall of the first sidewall spacer. A third sidewall spacer is formed from the second dielectric material, on a sidewall of the second sidewall spacer. An interlayer dielectric layer is formed from the first dielectric material, on a sidewall of the third sidewall spacer. A second electrode is formed on the mandrel, the first sidewall spacer, the second sidewall spacer, and the third sidewall spacer. Spacer remnants are formed on a sidewall of the first electrode and include the second dielectric material and the third dielectric material.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide conductive bridge random access memory (CBRAM) devices that have structures to guide the formation of a conductive bridge. This improves the performance of the CBRAM by increasing the uniformity and reproducibility of the bridge's electrical properties. Toward that end, some embodiments of the present invention use an interface between heterogeneous oxide layers to provide locations for preferential formation of conductive bridges. The heterogeneous oxides can be formed by spacer formation using a conformal deposition step, followed by an anisotropic etch, which can be precisely controlled. In particular embodiments, metal cations from an electrode diffuse along a path determined by the dielectric layer interfaces to form the conductive bridges.

Figure 1:
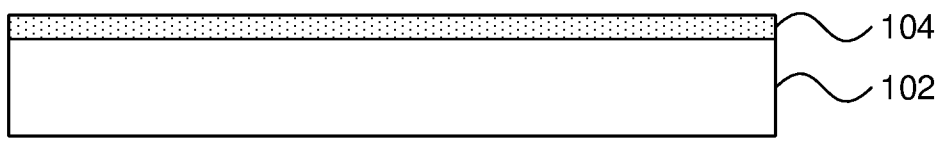
FIG. 1 is a cross-sectional view of a step in the formation of a conductive bridge random access memory (CBRAM) device that has uniform and reproducible paths for the formation of conductive bridges, showing the formation of a layer of conductive material on a substrate in accordance with an embodiment of the present invention.

Referring now to the drawings in which like numerals represent the same or similar elements and initially to FIG. 1, a cross-sectional view of a step in the forming of a CBRAM device with a repeatable bridge formation location is shown. A substrate layer 102 is shown. It is specifically contemplated that the substrate can be a dielectric layer, such as silicon dioxide. However, any appropriate electrically insulating material can be used instead. In some embodiments, the substrate layer 102 that is shown is only the top layer of a multi-layer device, which can include any number of conductive, dielectric, and/or device layers that are not shown herein.

A first electrode layer 104 is formed from a conductive material on the substrate layer 102. The first electrode layer 104 can be formed from any appropriate conductive material. In some embodiments, the electrode layer can be formed from titanium nitride or platinum, but it should be understood that alternative conductive materials include tungsten, nickel, titanium, molybdenum, tantalum, copper, silver, gold, ruthenium, iridium, rhenium, rhodium, and alloys thereof. The first electrode layer 104 may alternatively be formed from a doped semiconductor material such as, e.g., doped polysilicon.

The first electrode layer 104 may be formed by any appropriate process including, e.g., chemical vapor deposition (CVD), physical vapor deposition (PVD), atomic layer deposition (ALD), or gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

Figure 2:
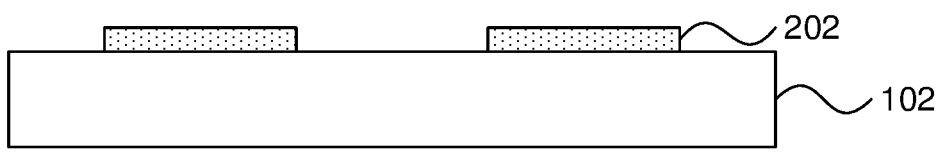
FIG. 2 is a cross-sectional view of a step in the formation of a CBRAM device that has uniform and reproducible paths for the formation of conductive bridges, showing etching the layer of conductive material into bottom contacts in accordance with an embodiment of the present invention.

Referring now to FIG. 2, a cross-sectional view of a step in the forming of a CBRAM device with a repeatable bridge formation location is shown. The first electrode layer 104 is patterned into electrodes 202. This process can be performed, for example, using photolithographic techniques to form a pattern mask over the first electrode layer 104, followed by an etch to remove the electrode material that is not covered by the mask. The electrodes 202 can be patterned into distinct device regions, with each electrode 202 forming a bottom electrode of a respective device.

Figure 3:
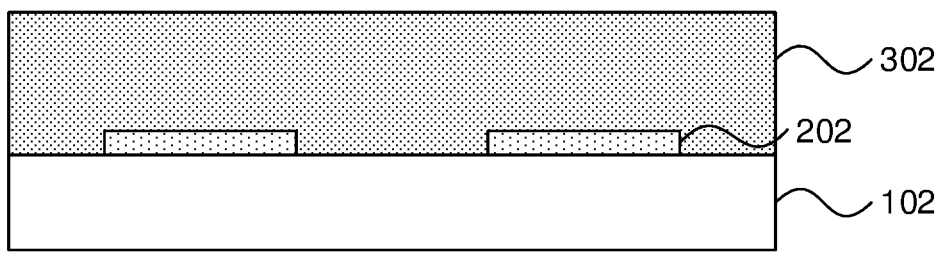
FIG. 3 is a cross-sectional view of a step in the formation of a CBRAM device that has uniform and reproducible paths for the formation of conductive bridges, showing forming a layer of first dielectric material over the electrodes in accordance with an embodiment of the present invention.

Referring now to FIG. 3, a cross-sectional view of a step in the forming of a CBRAM device with a repeatable bridge formation location is shown. A layer of first dielectric material 302 is deposited over the substrate 102 and the electrodes 202. The first dielectric material 302 can be formed from an oxide, such as an aluminum oxide, or a hardmask material such as silicon nitride. The first dielectric material 302 can be formed using any appropriate deposition process, including CVD, ALD, PVD, GCIB deposition, or a spin-on deposition.

Figure 4:
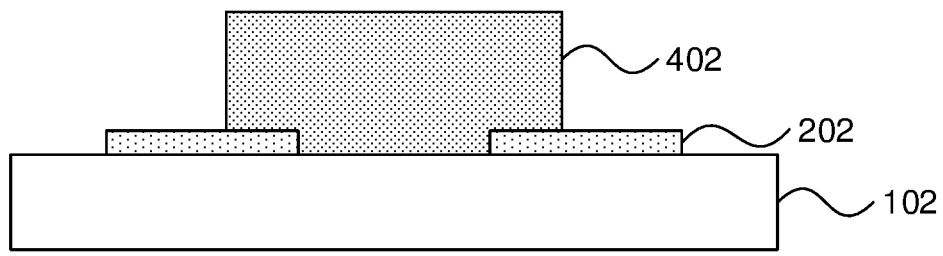
FIG. 4 is a cross-sectional view of a step in the formation of a CBRAM device that has uniform and reproducible paths for the formation of conductive bridges, showing etching the layer of first dielectric material into a mandrel in accordance with an embodiment of the present invention.

Referring now to FIG. 4, a cross-sectional view of a step in the forming of a CBRAM device with a repeatable bridge formation location is shown. The first dielectric material 302 is patterned and etched to form mandrel(s) 402. As shown, a single mandrel 402 can partially cover multiple electrodes 202. The positioning of the mandrel(s) defines the position of the conductive bridge, as it defines where subsequent dielectric layers will be formed.

Figure 5:
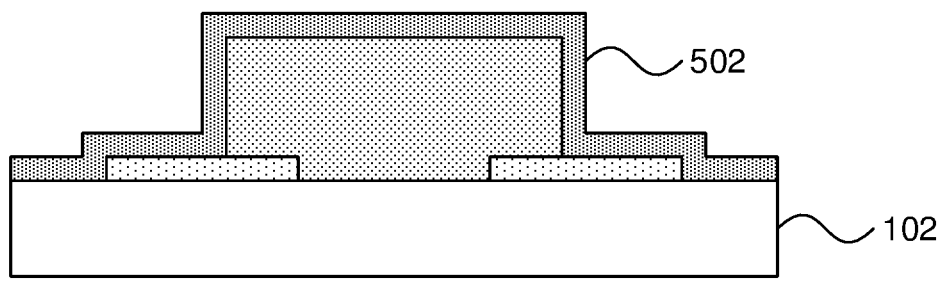
FIG. 5 is a cross-sectional view of a step in the formation of a CBRAM device that has uniform and reproducible paths for the formation of conductive bridges, showing the formation of a conformal layer of second dielectric material in accordance with an embodiment of the present invention.

Referring now to FIG. 5, a cross-sectional view of a step in the forming of a CBRAM device with a repeatable bridge formation location is shown. A layer of second dielectric material 502 is conformally deposited over the exposed surfaces using an appropriate conformal deposition process. It is specifically contemplated that the second dielectric material can include hafnium dioxide, tantalum oxide, and/or titanium oxide, but it should be understood that any appropriate dielectric material can be used that is distinct from the first dielectric material 302.

Figure 6:
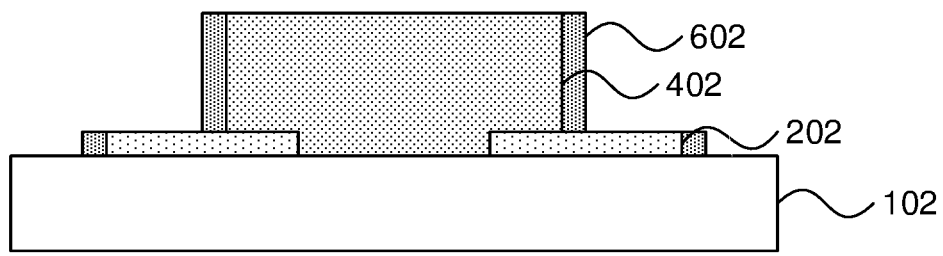
FIG. 6 is a cross-sectional view of a step in the formation of a CBRAM device that has uniform and reproducible paths for the formation of conductive bridges, showing etching the layer second dielectric material to form first sidewall structures on the mandrel in accordance with an embodiment of the present invention.

Referring now to FIG. 6, a cross-sectional view of a step in the forming of a CBRAM device with a repeatable bridge formation location is shown. The layer of second dielectric layer 502 is etched using an anisotropic etch, such as a reactive ion etch (RIE), to remove material from horizontal surfaces. This leaves behind sidewall structures 602 formed from the second dielectric material.

RIE is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

Figure 7:
FIG. 7 is a cross-sectional view of a step in the formation of a CBRAM device that has uniform and reproducible paths for the formation of conductive bridges, showing forming second sidewall structures from a third dielectric material on the first sidewall structures in accordance with an embodiment of the present invention.

Referring now to FIG. 7, a cross-sectional view of a step in the forming of a CBRAM device with a repeatable bridge formation location is shown. A layer of third dielectric material is conformally deposited and then etched with an RIE to form sidewall structures 702 of the third dielectric material. It is specifically contemplated that the third dielectric material is different from the second dielectric material, but can be the same as the first dielectric material. It is specifically contemplated that the third dielectric material can be an aluminum oxide, though other oxide materials can be used instead. The heterogeneous oxide interface between the second dielectric material and the third dielectric material forms a preferential diffusion path for metal cations.

Figure 8:
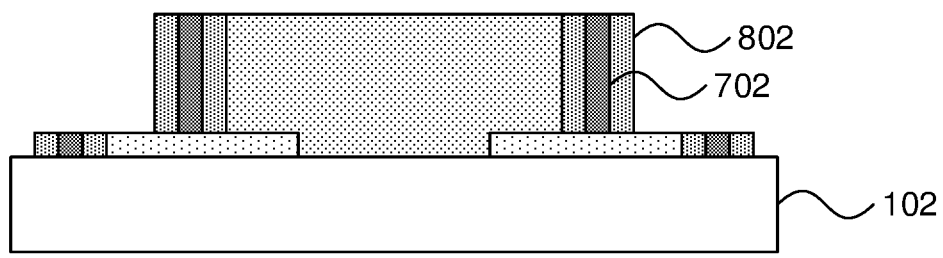
FIG. 8 is a cross-sectional view of a step in the formation of a CBRAM device that has uniform and reproducible paths for the formation of conductive bridges, showing forming third sidewall structures from the second dielectric material on the second sidewall structures in accordance with an embodiment of the present invention.

Referring now to FIG. 8, a cross-sectional view of a step in the forming of a CBRAM device with a repeatable bridge formation location is shown. A layer of fourth dielectric material is conformally deposited and then etched with an RIE to form sidewall structures 802 of the fourth dielectric material. It is specifically contemplated that the fourth dielectric material is different from the third dielectric material, but can be the same as the second dielectric material. Any number of sidewall structures can be formed in this manner to increase the number of heterogeneous oxide interfaces.

Figure 9:
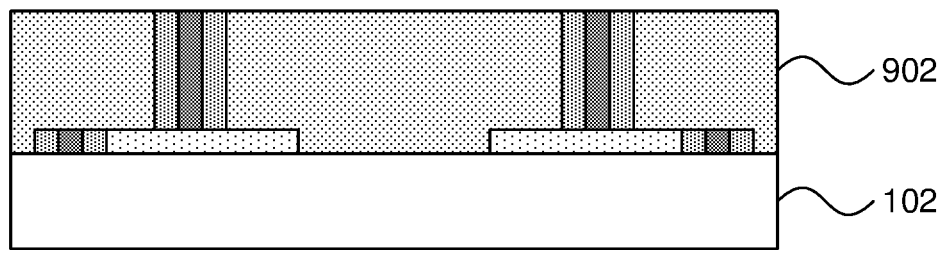
FIG. 9 is a cross-sectional view of a step in the formation of a CBRAM device that has uniform and reproducible paths for the formation of conductive bridges, showing forming an interlayer dielectric layer from the first dielectric material in accordance with an embodiment of the present invention.

Referring now to FIG. 9, a cross-sectional view of a step in the forming of a CBRAM device with a repeatable bridge formation location is shown. Additional first dielectric material is deposited over the exposed structures and is then polished down to the top level of the sidewall structures using, for example, a chemical mechanical planarization (CMP) process. CMP is performed using, e.g., a chemical or granular slurry and mechanical force to gradually remove upper layers of the device. The slurry may be formulated to be unable to dissolve, for example, one or more of the second, third, and fourth dielectric materials, resulting in the CMP process's inability to proceed any farther than that layer. This produces interlayer dielectric 902.

Although the embodiments described herein specifically illustrate multiple different oxide layers between the mandrel 402 and the interlayer dielectric 902, it should be understood that embodiments of the present invention can include as few as one single oxide layer.

Figure 10:
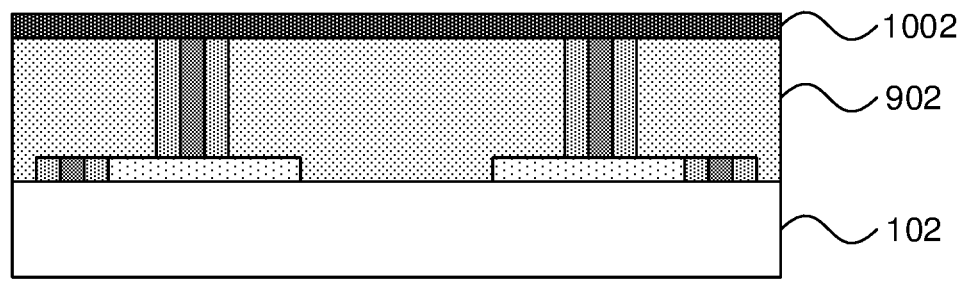
FIG. 10 is a cross-sectional view of a step in the formation of a CBRAM device that has uniform and reproducible paths for the formation of conductive bridges, showing forming a layer of second conductive material over the layers of heterogeneous dielectric materials in accordance with an embodiment of the present invention.

Referring now to FIG. 10, a cross-sectional view of a step in the forming of a CBRAM device with a repeatable bridge formation location is shown. A second electrode layer 1002 is formed over the interlayer dielectric 902 by any appropriate deposition process. The second electrode layer 1002 can be formed from an appropriate conductive material that undergoes electromigration, such as silver, copper, and alloys thereof.

Figure 11:
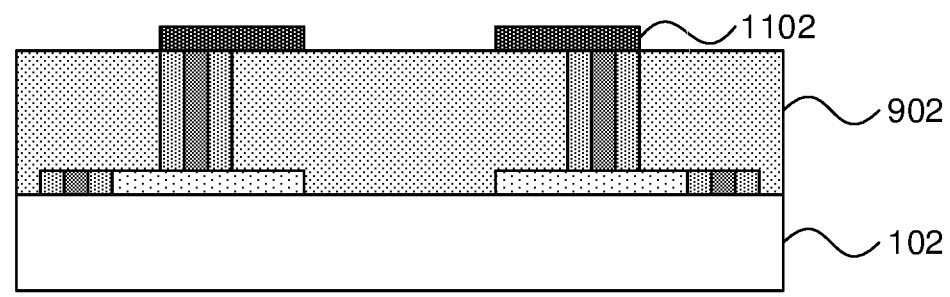
FIG. 11 is a cross-sectional view of a step in the formation of a CBRAM device that has uniform and reproducible paths for the formation of conductive bridges, showing etching the layer of second conductive material into top contacts in accordance with an embodiment of the present invention.

Referring now to FIG. 11, a cross-sectional view of a step in the forming of a CBRAM device with a repeatable bridge formation location is shown. The second electrode layer 1002 is patterned and etched into second electrodes for each device. It is particularly contemplated that the second electrodes 1102 can have a smaller area than the first electrodes 104. During operation, when the resistance value of the device is being set, cations from the second electrode 1102 will migrate along the interfaces between the sidewall structures, thereby changing the resistance of the device.

Figure 12:
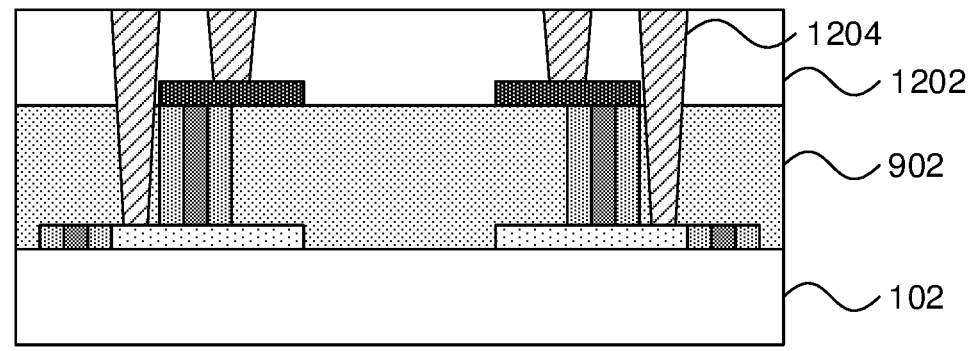
FIG. 12 is a cross-sectional view of a step in the formation of a CBRAM device that has uniform and reproducible paths for the formation of conductive bridges, showing forming conductive vias to the top and bottom contacts in accordance with an embodiment of the present invention.

Referring now to FIG. 12, a cross-sectional view of a step in the forming of a CBRAM device with a repeatable bridge formation location is shown. A final interlayer dielectric 1202 is deposited over the interlayer dielectric 902. Respective conductive contacts 1204 are formed to the first electrodes 104 and to the second electrodes 1102 by forming vias in the interlayer dielectrics 902 and 1202 and filling those vias with an appropriate conductive material by any appropriate deposition process.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C).

This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 13:
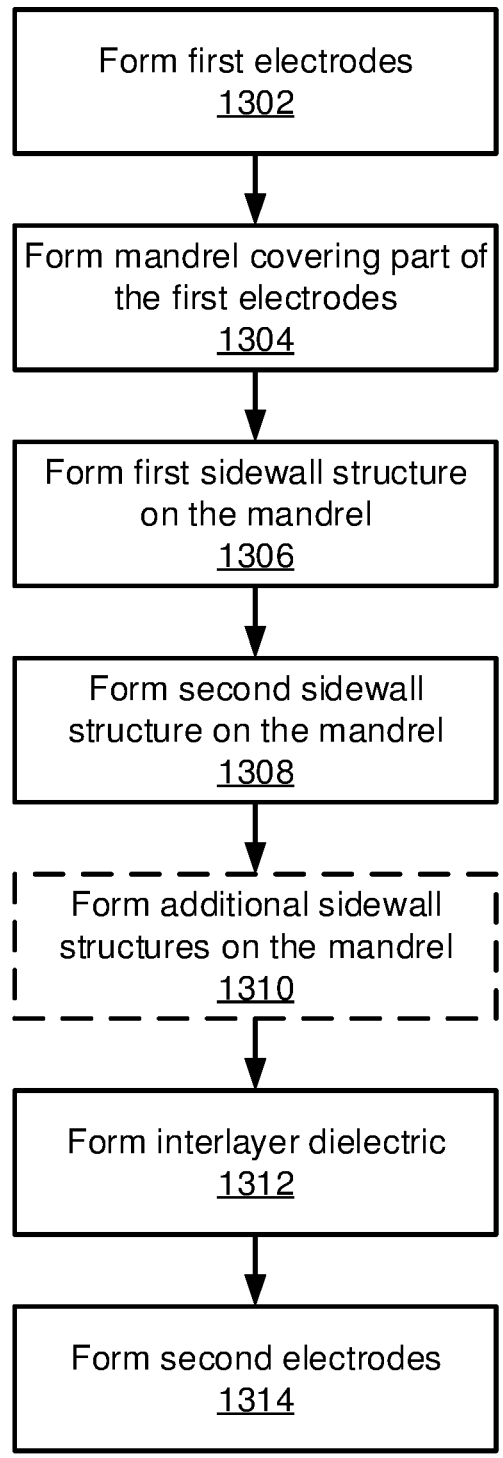
FIG. 13 is a block/flow diagram of a method of forming a CBRAM device in accordance with an embodiment of the present invention.

Referring now to FIG. 13, a method of forming a CBRAM device is shown. Block 1302 forms first electrodes 202 on an underlying substrate 102 by, e.g., depositing a first conductive material, patterning the first conductive material, and etching the first conductive material into electrode regions. Block 1304 forms a mandrel 402 on the first electrodes 202, partially covering the first electrodes 202, with sidewalls that are positioned over a middle portion of respective first electrodes 202. The mandrels 402 can be formed by depositing a first dielectric material and then patterning and etching the first dielectric material.

Block 1306 forms first sidewall structures 602 on the sidewalls of the mandrel 402, for example by conformally depositing a second dielectric material and anisotropically etching the second dielectric material from horizontal surfaces. Block 1308 forms second sidewall structures 702 on the sidewalls of the first sidewall structures 602 by conformally depositing a third dielectric material and anisotropically etching the third dielectric material from horizontal surfaces. Block 1310 optionally repeats the formation of heterogeneous oxide layers as many times as needed.

Block 1312 forms an interlayer dielectric around the mandrel 402 and sidewall spacers by depositing a dielectric material and polishing it down with a CMP process that stops on the dielectric material of at least one of the sidewall spacers. Block 1314 forms second electrodes 1102 over the sidewall spacers. At this stage an additional interlayer dielectric can be formed with appropriate conductive contacts to the respective electrodes.

Having described preferred embodiments of CBRAM with controlled bridge location (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A conductive bridge random access memory (CBRAM) device, comprising:
a first electrode;
a plurality of vertical dielectric structures formed from heterogeneous dielectric materials on the first electrode, including:
a mandrel, formed from a first dielectric material that includes a hardmask material, that partially covers the first electrode;
a first sidewall spacer, formed from a second dielectric material, different from the first dielectric material, on a sidewall of the mandrel;
a second sidewall spacer, formed from a third dielectric material, different from the second dielectric material, on a sidewall of the second sidewall spacer; and
a third sidewall spacer, formed from the second dielectric material, on a sidewall of the second sidewall spacer; and
a second electrode on the plurality of vertical dielectric structures.

2. The CBRAM device of claim 1, wherein the plurality of vertical dielectric structures further includes an interlayer dielectric, formed from the first dielectric material, on a sidewall of the first sidewall spacer.

3. The CBRAM device of claim 1, further comprising spacer remnants on a sidewall of the first electrode that correspond to materials of the plurality of vertical dielectric structures.

4. The CBRAM devices of claim 3, wherein the spacer remnants comprise three layers of dielectric material positioned side-by-side.

5. The CBRAM device of claim 1, wherein the second electrode is formed from a conductive material that undergoes electromigration when a current is applied.

6. The CBRAM device of claim 5, wherein the second electrode is formed from a material selected from the group consisting of silver, copper, and silver/copper alloys.

7. A conductive bridge random access memory (CBRAM) device, comprising:
a first electrode;
a plurality of vertical dielectric structures formed from heterogeneous dielectric materials on the first electrode, including:
a mandrel, formed from a first dielectric material that includes a hardmask material, that partially covers the first electrode;
a first sidewall spacer, formed from a second dielectric material, different from the first dielectric material, on a sidewall of the mandrel;
a second sidewall spacer, formed from a third dielectric material, different from the second dielectric material, on a sidewall of the second sidewall spacer; and a third sidewall spacer, formed from the second dielectric material, on a sidewall of the second sidewall spacer;

spacer remnants on a sidewall of the first electrode that correspond to materials of the plurality of vertical dielectric structures; and a second electrode on the plurality of vertical dielectric structures, formed from a material that undergoes electromigration when a current is applied.

8. The CBRAM device of claim 7, wherein the plurality of vertical dielectric structures further includes an interlayer dielectric, formed from the first dielectric material, on a sidewall of the first sidewall spacer.

9. The CBRAM device of claim 7, wherein the second electrode is formed from a material selected from the group consisting of silver, copper, and silver/copper alloys.

10. The CBRAM devices of claim 7, wherein the spacer remnants comprise three layers of dielectric material positioned side-by-side.

11. A conductive bridge random access memory (CBRAM) device, comprising:

a first electrode;

a plurality of vertical dielectric structures formed from heterogeneous dielectric materials on the first electrode;

a second electrode on the plurality of vertical dielectric structures; and spacer remnants on a sidewall of the first electrode that correspond to materials of the plurality of vertical dielectric structures, comprising three layers of dielectric material positioned side-by-side.

12. The CBRAM device of claim 11, wherein the plurality of vertical dielectric structures includes a mandrel, formed from a first dielectric material, that partially covers the first electrode.

13. The CBRAM device of claim 12, wherein the plurality of vertical dielectric structures further includes a first sidewall spacer, formed from a second dielectric material, different from the first dielectric material, on a sidewall of the mandrel.

14. The CBRAM device of claim 13, wherein the plurality of vertical dielectric structures further includes a second sidewall spacer, formed from a third dielectric material, different from the second dielectric material, on a sidewall of the second sidewall spacer.

15. The CBRAM device of claim 13, wherein the plurality of vertical dielectric structures further includes an interlayer dielectric, formed from the first dielectric material, on a sidewall of the first sidewall spacer.

16. The CBRAM device of claim 11, wherein the second electrode is formed from a conductive material that undergoes electromigration when a current is applied.

17. The CBRAM device of claim 16, wherein the second electrode is formed from a material selected from the group consisting of silver, copper, and silver/copper alloys.

* * * * *